(12) United States Patent
Suzuki et al.

(10) Patent No.: US 7,905,149 B2
(45) Date of Patent: Mar. 15, 2011

(54) PHYSICAL SENSOR AND METHOD OF PROCESS

(75) Inventors: Kengo Suzuki, Hitachinaka (JP); Takeshi Harada, Tokyo (JP); Yasuo Osone, Kasumigaura (JP); Masahide Hayashi, Mito (JP); Teruhisa Akashi, Moriya (JP)

(73) Assignee: Hitachi, Ltd., Tokyo (JP)

( * ) Notice: Subject to any disclaimer, the term of this patent is extended or adjusted under 35 U.S.C. 154(b) by 306 days.

(21) Appl. No.: 12/175,347

(22) Filed: Jul. 17, 2008

(65) Prior Publication Data
US 2009/0020419 A1 Jan. 22, 2009

(30) Foreign Application Priority Data

Jul. 20, 2007 (JP) ................................ 2007-189657

(51) Int. Cl.
*G01B 7/16* (2006.01)
(52) U.S. Cl. .......................................... 73/777; 73/760
(58) Field of Classification Search ............. 73/760–777
See application file for complete search history.

(56) References Cited

U.S. PATENT DOCUMENTS

| 5,610,431 | A | 3/1997 | Martin |
| 6,225,145 | B1 | 5/2001 | Choi et al. |
| 6,263,735 | B1 | 7/2001 | Nakatani et al. |
| 6,521,948 | B2 * | 2/2003 | Ebina ........................... 257/347 |
| 2001/0001311 | A1 * | 5/2001 | Park et al. .................... 600/561 |
| 2004/0005628 | A1 * | 1/2004 | Foster ............................ 435/7.1 |
| 2005/0127499 | A1 | 6/2005 | Harney et al. |
| 2008/0042260 | A1 * | 2/2008 | Jeong et al. ................... 257/704 |

FOREIGN PATENT DOCUMENTS

| JP | 6-109755 A | 4/1994 |
| JP | 8-316762 A | 11/1996 |
| JP | 2004-255562 A | 9/2004 |
| WO | WO 99/13343 A1 | 3/1999 |
| WO | WO 2005/006432 A2 | 1/2005 |
| WO | WO 2005/006432 A3 | 1/2005 |

OTHER PUBLICATIONS

European Search Report dated Nov. 27, 2008 (Six (6) pages).
Baldwin D F et al., "High density, high aspect ratio through-wafer electrical interconnect vias for mems packaging", ieee transactions on advanced packaging, ieee service center, Piscataway, NJ, US, vol. 26, No. 3, Aug. 1, 2003, pp. 302-309, XP011102265.
Japanese Office Action dated Nov. 24, 2009 (five (5) pages).

* cited by examiner

*Primary Examiner* — Max Noori
(74) *Attorney, Agent, or Firm* — Crowell & Moring LLP

(57) ABSTRACT

There is provided a physical sensor which ensures long-term reliability and can be miniaturized and increased in density, and a method of producing the same. A physical sensor includes a supporting substrate, an element substrate that includes a sensor element and is joined to the supporting substrate through an insulating layer, a glass cap that covers an area of the sensor element and is joined to the element substrate, and a built-in electrode that is electrically connected to the sensor element. The built-in electrode is formed in a through hole passing through the element substrate, the insulating layer and the supporting substrate. A portion of the glass cap that covers an area of the built-in electrode is anodically bonded to the element substrate.

7 Claims, 6 Drawing Sheets

PHYSICAL SENSOR AND METHOD OF PROCESS

CLAIM OF PRIORITY

The present application claims priority from Japanese patent application JP 2007-189657 filed on Jul. 20, 2007, the content of which is hereby incorporated by reference into this application.

BACKGROUND OF THE INVENTION

1. Field of the Invention

The present invention relates to a physical sensor and a method of producing the same and is suitable for, in particular, physical sensors such as a pressure sensor, an acceleration sensor and yaw rate sensor and the method of producing the same.

2. Description of the Related Art

As a conventional physical sensor, there have been known a pressure sensor, an acceleration sensor and yaw rate sensor described in Japanese Patent Application Publication No. 2004-255562. The physical sensor includes a semiconductor substrate, an insulating film formed on the semiconductor substrate, a structural layer formed on the insulating film, a glass substrate anodically bonded to the structural layer while a vacuum chamber for protecting the structure of the structural layer is being formed, a via hole in the glass substrate formed in a position corresponding to the underbump metal of the structural layer and a solder ball which is provided for the via hole and coupled with the underbump metal to capture a detected signal.

In the physical sensor described in the above JP 2004-255562, the via hole is formed in the glass substrate. There have been available, roughly speaking, three methods for processing the via hole in the glass substrate: first for processing using chemical reaction; second for processing using laser processing; and third for processing using machining.

Firstly, processing using chemical reaction, which is the first processing method, is described below. Wet etching using a solvent and dry etching using gas apply to the processing using chemical reaction. The above processing has an advantage in that the formation of a mask enables collectively patterning a pattern. For a glass processing, however, a hole is enlarged because it is difficult to use the difference between wet etching rates due to a difference in crystal orientation. Dry etching is capable of processing a hole with a narrow gap depending on the selection of conditions, however, it takes several times to several tens of times as long as other processing.

Secondly, processing using laser processing, which is the second processing method, includes excimer laser processing and $CO_2$ laser processing. The bore diameter of laser processing is determined by a spot diameter, enabling narrow-gap processing. However, the laser processing processes holes one by one, which increases the number of holes to takes a long time to process. Recently a wafer level package has prevailed, a wafer increases in diameter and the number of processed holes required for one wafer tends to increase.

Thirdly, processing using machining, which is the third processing method, is described. The machining includes drilling and sand blasting. The drilling is capable of forming a hole perpendicular to a wafer surface, however, it is necessary for the drilling to process holes one by one, as is the case with the laser processing. The sand blasting allows holes in a wafer to be simultaneously processed. However, it is substantially impossible for the sand blasting to process a narrow-gap hole due to the problems in that a processed wall is tapered, chippings are produced on the side where processing is omitted and a processed surface is easily cracked.

As described above, it is therefore difficult for the above methods to process a narrow gap in the glass substrate without spending a long time, which bottlenecks the miniaturization and high density of a physical sensor and high density.

SUMMARY OF THE INVENTION

The present invention has its object to provide a physical sensor which ensures a long-term reliability and can be miniaturized and increased in density, and a method of producing the same.

According to a first aspect of the present invention provided to achieve the above object, a physical sensor includes: a supporting substrate; an element substrate that includes a sensor element and is joined to the supporting substrate through an insulating layer; a glass cap that covers an area of the sensor element and is joined to the element substrate; and a built-in electrode that is electrically connected to the sensor element; wherein the built-in electrode is formed in a through hole passing through the element substrate, the insulating layer and the supporting substrate, and a portion of the glass cap that covers the area of the built-in electrode is anodically bonded to the element substrate.

The examples of preferable configuration in the first aspect of the present invention are described below.

[1] The element substrate includes a frame forming the periphery thereof and the sensor element formed inside the frame, and the sensor element is arranged in a hermetic seal portion surrounded by the frame, the insulating layer, the supporting substrate and the glass cap.

[2] The element substrate and the supporting substrate are formed of silicon, the insulating layer is formed of a silicon oxide film, and the through hole of the element substrate and the supporting substrate for passing the built-in electrode is formed by lithography or etching with a high aspect ratio.

[3] In the above item [1], the element substrate including the frame and the sensor element is formed of silicon with a low resistance, an electrode portion of the sensor element is formed of an island-shaped electrode portion insulated with the insulating layer and the glass cap, and the built-in electrode is formed to electrically conduct in the through hole of the island-shaped electrode portion and formed through an insulating film in the through hole of the supporting substrate corresponding to the through hole of the island-shaped electrode portion.

[4] In the above item [3], the through hole of the island-shaped electrode portion is smaller in diameter than the through hole of the supporting substrate corresponding to the through hole of the island-shaped electrode portion.

[5] In the above items [3] or [4], the built-in electrode is formed by filling inside the through hole of the island-shaped electrode portion and formed into a thin film in the through hole of the supporting substrate corresponding to the through hole of the island-shaped electrode portion.

[6] In the above items [3] or [4], the built-in electrode is formed by filling in both the through hole of the island-shaped portion electrode and the through hole of the supporting substrate corresponding to the through hole of the island-shaped electrode portion.

[7] The element substrate and the supporting substrate are formed of low-resistance single crystal silicon, and the built-in electrode is formed of low-resistance poly Si.

[8] The built-in electrode is formed of electrically conductive metal.

[9] The built-in electrode is formed to electrically conduct through a poly Si film with a low resistance provided on the surface of the island-shaped electrode portion.

According to a second aspect of the present invention, a method of producing a physical sensor including a supporting substrate, an element substrate that includes a sensor element and is joined to the supporting substrate through an insulating layer, a glass cap that covers an area of the sensor element and is joined to the element substrate, and a built-in electrode that is electrically connected to the sensor element, the method includes the steps of: producing an SOI substrate such that an insulating layer is sandwiched between a silicon supporting substrate and the silicon element substrate with a sensor element and joined thereto; forming a through hole for forming the built-in electrode in the SOI substrate; forming the built-in electrode so that the built-in electrode is passed through the through hole of the SOI substrate; and anodically bonding a portion of the glass cap that covers the area of the built-in electrode to the element substrate.

The examples of more preferable configuration in the second aspect of the present invention are described below.

[1]

The method of producing the physical sensor includes the steps of: forming a hole with a large diameter in the supporting substrate from the side opposite to the element substrate of the SOI substrate; forming a hole with a small diameter in the element substrate from the side opposite to the supporting substrate of the SOI substrate; and forming an insulating film on the inner surface of the hole with the large diameter.

According to the present invention, it is possible to provide a physical sensor which ensures long-term reliability and can be miniaturized and increased in density, and a method of producing the same.

DETAILED DESCRIPTION OF THE PREFERRED EMBODIMENTS

Figure 1:
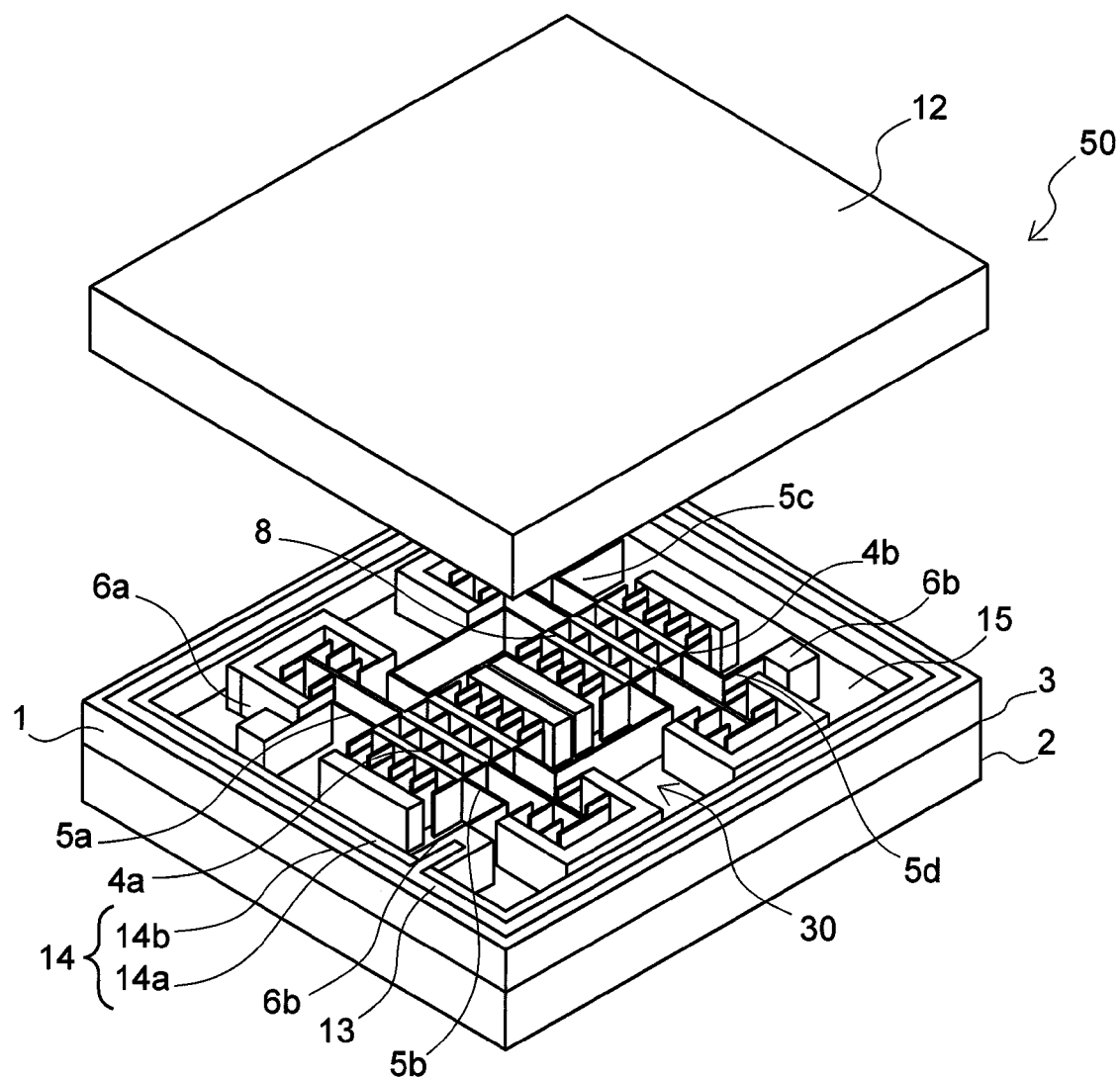
FIG. 1 is a perspective view of a physical sensor of a first embodiment according to the present invention.

Plural embodiments of the present invention are described below with reference to the drawings. The same reference numerals and characters in the figure of each embodiment denote the same or the corresponding components. The present invention can be rendered more effective by properly combining the embodiments together.

First Embodiment

A physical sensor 50 and a method of producing the same according to the first embodiment of the present invention are described using FIGS. 1 to 4C.

Figure 2:
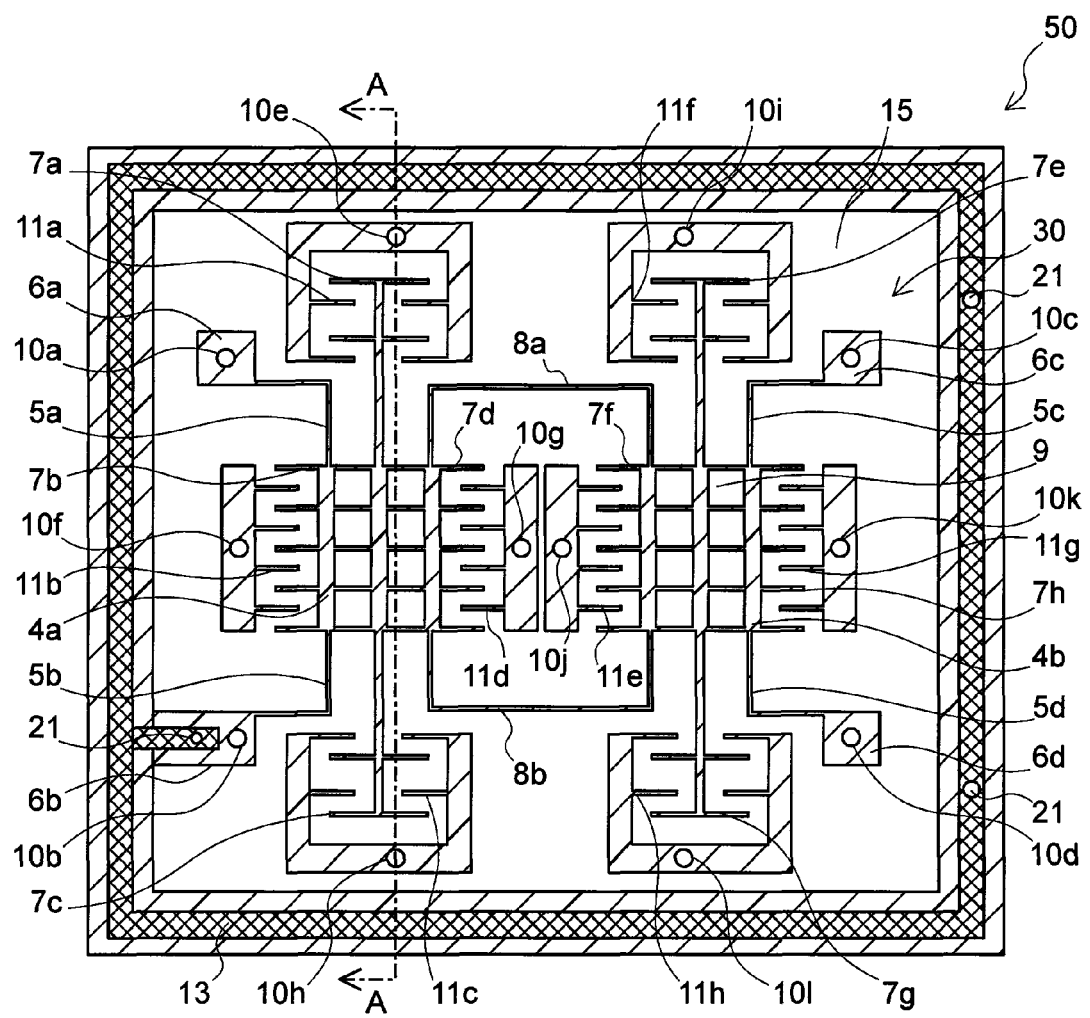
FIG. 2 is a top view of the physical sensor in FIG. 1 with a glass cap omitted.
Figure 3:
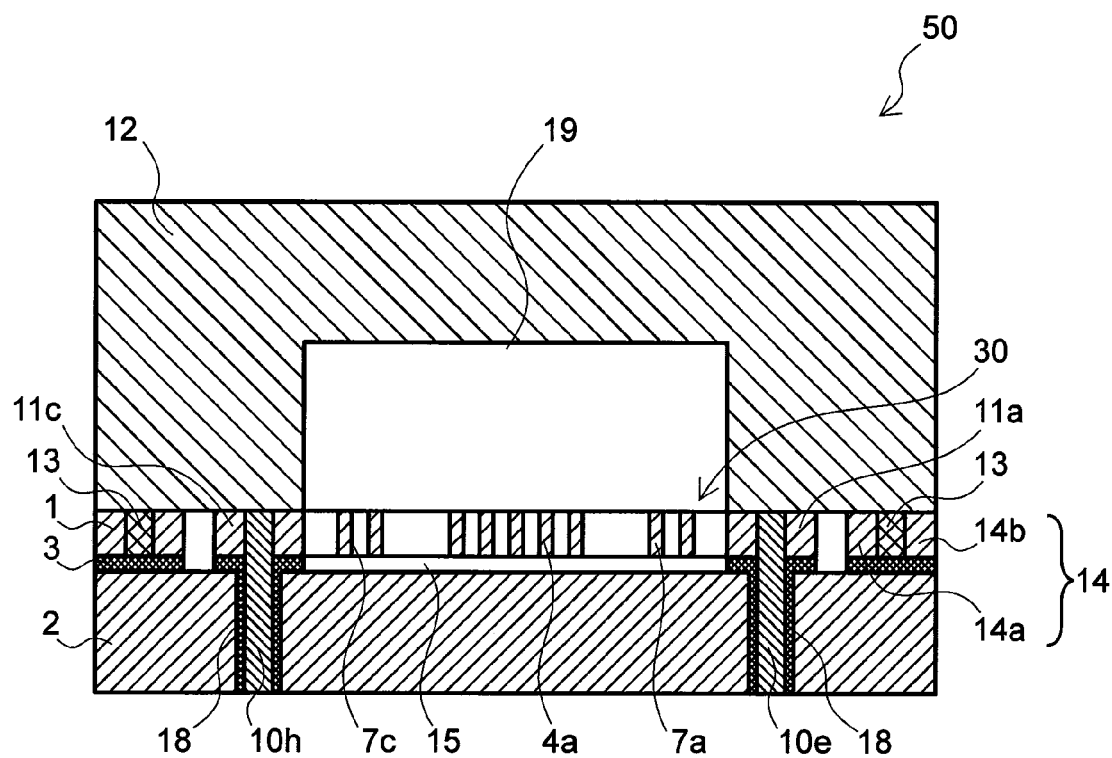
FIG. 3 is a cross section taken along line A-A in FIG. 2.

The physical sensor 50 is described with reference to FIGS. 1 to 3. FIG. 1 is a perspective view of the physical sensor 50 of the present embodiment with a glass cap 12 removed. FIG. 2 is a top view of the physical sensor 50 in FIG. 1 with the glass cap 12 omitted. FIG. 3 is a cross section taken along line A-A in FIG. 2.

The physical sensor 50 of the present embodiment a compound sensor that is composed of a yaw rate sensor and an acceleration sensor. The physical sensor 50 includes a supporting substrate 2, an element substrate 1 that includes a sensor element 30 and is placed above the supporting substrate 2 through an insulating layer 3, a glass cap 12 that covers the area of the sensor 30 and is joined to the element substrate 1, and a built-in electrode 10 that is formed in a through hole passing through the element substrate 1, the insulating layer 3 and the supporting substrate 2 and electrically connected to the sensor element 30. The built-in electrode 10 is a generic term of reference numerals 10a to 10l described later.

The supporting substrate 2 is formed in a rectangular shape and configured by a silicon substrate of a single crystal silicon material with a low resistance. The element substrate 1 is formed in the same rectangular shape as the supporting substrate 2, made of a single crystal silicon material with a low resistance. The element substrate 1 is composed of a frame 14 formed about the periphery thereof and the sensor element 30 formed inside the frame 14. The insulating layer 3 serves to insulate the element substrate 1 from the supporting substrate 2 and is formed of a silicon oxide film. Thus, the present embodiment uses a laminated substrate (or, a silicon-on-insulator (SOI) substrate) in which the insulating layer 3 is sandwiched between the element substrate 1 and the supporting substrate 2, so that these components can be easily produced.

The frame 14 is joined to the supporting substrate 2 through the insulating layer 3, anodically bonded to the glass cap 12 and interposed between the supporting substrate 2 and the glass cap 12. The frame 14 has a gas adsorbent 13 about the entire periphery thereof and is separated into an inner frame 14a and an outer frame 14b. The upper face of the gas adsorbent 13 contacts the glass cap 12 and the lower face thereof contacts the insulating layer 3 to surround the outer periphery of a hermetic seal portion 15.

The sensor element 30 is arranged in the hermetic seal portion 15 surrounded by the frame 4, the insulating layer 3, the supporting substrate 2 and the glass cap 12. The sensor element 30 is provided with plural oscillatory bodies 4a and 4b, plural beams 5a to 5d, plural anchors 6a to 6d being supporting portions for supporting the oscillatory bodies 4a and 4b, plural movable electrodes 7a to 7h and plural fixed electrodes 11a to 11h.

The oscillatory bodies 4a and 4b, the beams 5a to 5d and the movable electrodes 7a to 7h are floated over the supporting substrate 2 by a thickness of the insulating layer 3. The anchors 6a to 6d and the fixed electrodes 11a to 11h are fixed with the supporting substrate 2 through the insulating layer 3.

The oscillatory bodies 4a and 4b are supported by the anchors 6a to 6d through the beams 5a to 5d with the oscillatory bodies 4a and 4b being oscillable in the in-plane direction and oscillated by applied acceleration or yaw rate. The two oscillatory bodies 4a and 4b are coupled together by mechanical links 8a and 8b. Oscillation energy of both the oscillatory bodies 4a and 4b is transferred between the oscillatory bodies 4a and 4b through the mechanical links 8a and 8b.

The beams 5a to 5d have functions to displace the oscillatory bodies 4a and 4b in the in-plane direction by using an inertia force generated in the oscillatory bodies 4a and 4b with mass when received acceleration or yaw rate in the in-plane direction and to restore the oscillatory bodies 4a and 4b to their initial state as soon as the application of acceleration or yaw rate is finished. The anchors 6a to 6d are arranged at four places around the periphery of the oscillatory bodies 4a and 4b and support the oscillatory bodies 4a and 4b in such a manner that the oscillatory bodies 4a and 4b are hung from the periphery.

The movable electrodes 7a to 7h have comb portions extending orthogonal to the direction in which the oscillatory bodies 4a and 4b are oscillated and are oscillated with the oscillatory bodies 4a and 4b. The fixed electrode 11a to 11h have comb portions opposing the movable electrodes 7a to 7h and detect variation in electrostatic capacity generated between the comb portions of the movable electrodes 7a to 7h and the fixed electrode 11a to 11h when acceleration or yaw rate is applied.

The oscillatory bodies 4a and 4b are provided with plural trench holes 9 that are used when the insulating layer 3 is subjected to a sacrifice-layer etching process. The reason the plural trench holes 9 is provided is described below. That is to say, in the present embodiment, when the oscillatory bodies 4a and 4b are larger than the anchors 6a to 6d and the sacrifice-layer etching process is performed, the insulating layer 3 underlying the anchors 6a to 6d to be fixed to the supporting substrate 2 is etched earlier than the insulating layer 3 underlying the oscillatory bodies 4a and 4b, resultantly floating the anchors 6a to 6d. Therefore, the plural trench holes 9 are provided to prevent the anchors 6a to 6d from being floated. In other words, the trench holes 9 are made to perform the sacrifice-layer etching not only from side of the oscillatory bodies 4a and 4b, but from the side of the trench holes, reducing a time required for the sacrifice-layer etching. Incidentally, the trench hole 9 is square in the present embodiment.

The built-in electrodes 10a to 10l are signal detecting wires for the sensor element 30 formed through the element substrate 1, the insulating layer 3 and the supporting substrate 2 and are configured of the built-in electrodes 10a to 10d on the side of the movable electrodes and the built-in electrodes 10e to 10l on the side of the fixed electrodes.

The built-in electrodes 10a to 10d on the side of the movable electrodes are formed so as to pass through the through holes of the anchors 6a to 6d of the element substrate 1 and the through holes of the insulating layer 3 and the supporting substrate 2, the through holes being provided at the portions corresponding to the through holes of the anchors 6a to 6d, and electrically connected to the movable electrodes 7a to 7h through the beams 5a to 5d and the oscillatory bodies 4a and 4b.

The built-in electrodes 10e to 10l on the side of the fixed electrodes are formed so as to pass through the through holes of the bases of the fixed electrodes 11a to 11h and the through holes of the insulating layer 3 and the supporting substrate 2, the through holes being provided at the portions corresponding to the through holes of the bases of the fixed electrodes 11a to 11h and electrically connected to the fixed electrodes 7a to 7h.

The through holes of the element substrate 1, the insulating layer 3 and the supporting substrate 2 are formed by lithography or etching. The through holes of the element substrate 1 and the supporting substrate 2 are formed with a high aspect ratio of one or more. Such a configuration allows the through holes to be processed at a narrow pitch, enabling the physical sensor 50 to be miniaturized and increased in density.

The built-in electrodes 10e to 10l are filled in the through holes of the anchors 6a to 6d and the fixed electrodes 7a to 7h that are formed of silicon with a low resistance not through an insulating film and electrically connected to the anchors 6a to 6d and the fixed electrodes 7a to 7h. The built-in electrodes 10e to 10l are caused to conduct only with the anchors 6a to 6d and the fixed electrodes 7a to 7h, but not caused to conduct with the supporting substrate 2 because the insulating film 18 intervenes between the built-in electrodes 10e to 10l and the supporting substrate 2.

Such a configuration allows the built-in electrodes 10e to 10l to be electrically connected to the anchors 6a to 6d and the fixed electrodes 7a to 7h simply and easily.

The glass cap 12 covers the element substrate 1 and is joined thereto to cover the entire sensor element 30, forming the hermetic seal portion 15, which restricts the transfer of gas between the hermetic seal portion 15 and the outside. The glass cap 12 and the frame 14 of the element substrate 1 are anodically bonded together around the entire periphery thereof. An anodic bonding method refers to a bonding method in which a positive and a negative electrode are connected to silicon to be joined and to glass respectively, a voltage is applied to aggregate and charge OH— on the interface between junction surfaces, thereby generating electrostatic force.

If plating, for example, is used as a material for the built-in electrodes 10e to 10l, gas or moisture may flow therein from the outside for the reasons of a void due to defective at the time of filling plating and peeling caused by difference in linear expansion coefficient between the plating and the supporting substrate 2. If poly Si, for example, is used as a material for the built-in electrodes 10e to 10l, it is enabled to suppress peeling caused by difference in linear expansion coefficient between the poly Si and the supporting substrate 2, however, the built-in electrodes 10e to 10l may be insufficiently filled. For this reason, in the present embodiment, the glass cap 12 covers the upper surface of the area of the built-in electrodes 10e to 10l and the periphery of the built-in electrodes 10e to 10l are anodically bonded to the anchors 6a to 6d and the fixed electrodes 7a to 7h. This prevents the built-in electrodes from forming routes of gas or moisture between the outside and the hermetic seal portion 15 even if the built-in electrodes 10e to 10l are insufficiently filled, ensuring a long-term reliability.

The application of a voltage causes the displacement of the oscillatory bodies 4a and 4b at the time of anodically bonding the glass cap 12 to the element substrate 1 to cause the oscillatory bodies 4a and 4b to abut on and adhere to the glass cap 12. For this reason, a collision preventing recess 19 for allowing the displacement of the oscillatory bodies 4a and 4b is formed. The recess 19 is formed by a sand blast.

In the present embodiment, a sensing performance is improved or stabilized by sealing gas in the hermetic seal portion 15 or evacuating almost all gases existing in the hermetic seal portion 15 to evacuate it to a high vacuum. It is important to prevent routes for gas and moisture from being formed between the outside and the hermetic seal portion 15 through the built-in electrodes 10a to 10l, in order to maintain the seal of gas and a high vacuum.

When acceleration is applied to the physical sensor 50 thus configured, the two oscillatory bodies 4a and 4b are displaced in the direction in which the acceleration is canceled each other by one oscillating mode and also in the same direction by inertial force. When a yaw rate around the z-axis is applied to the physical sensor 50, the two oscillatory bodies 4a and 4b are displaced so that the yaw rate is canceled each other by one oscillating mode in the x-axis direction and by Coriolis force in the y-axis direction. The above difference in the displacement direction is used to separate an acceleration signal from a yaw rate signal.

Figure 4A:
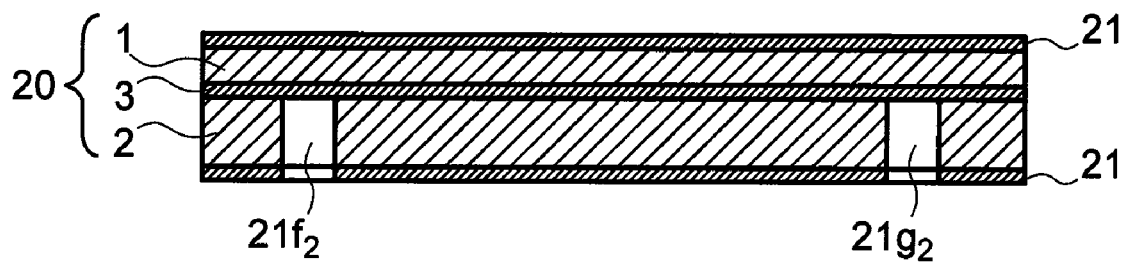
FIGS. 4A to 4C are cross sections illustrating a process for producing a built-in electrode of the physical sensor in FIG. 1.
Figure 4B:
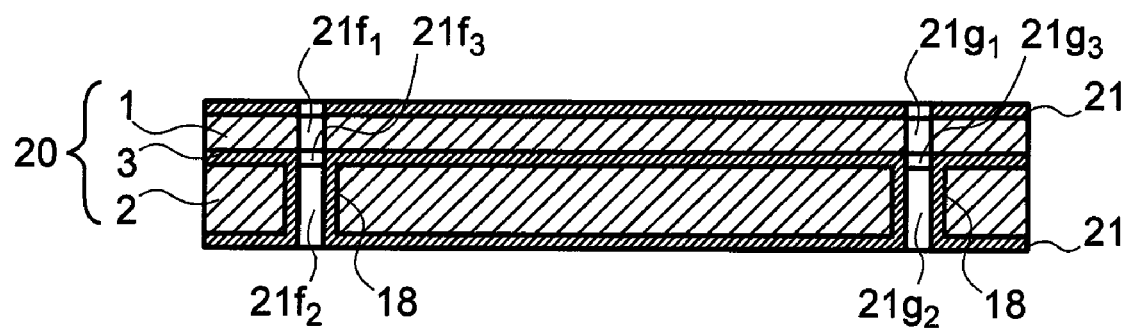
Figure 4C:
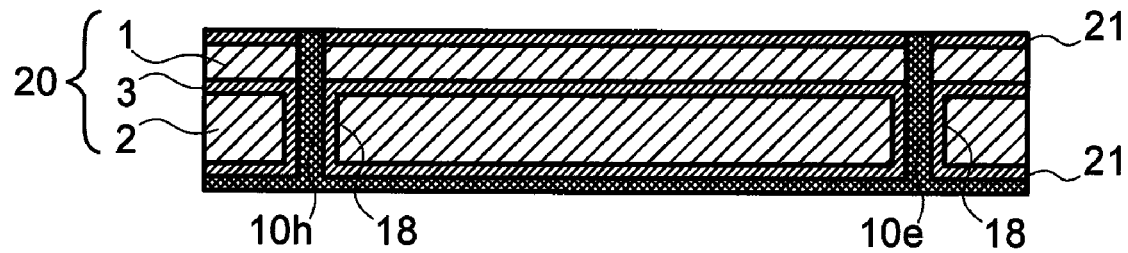

The production process for the built-in electrodes 10e and 10h is described with reference to FIG. 4A to 4C. FIG. 4A to 4C are cross sections illustrating a process for producing the built-in electrodes 10e and 10h of the physical sensor 50 in FIG. 1. Since other production processes for the built-in electrodes are the same, the built-in electrodes 10e and 10h are typified for description.

A silicon-on-insulator (SOI) substrate 20 is produced in which the insulting layer 3 of silicon oxide film is sandwiched and joined between two single crystal silicon substrates of the element substrate 1 and the supporting substrate 2. Both the element substrate 1 and the supporting substrate 2 of the SOI substrate 20 are formed of a single crystal silicon material with a low resistance.

As illustrated in FIG. 4A, an oxide film 21 is formed on the entire surface of the SOI substrate 20 by thermal oxidation to be used as a dry etching mask for forming the oscillatory body 4 on the element substrate 1. The oxide film 21 is patterned by using photolithography and etching technique to form a dry etching mask on the supporting substrate 2. Dry etching is performed with the oxide film 21 formed at the above process as a mask to form holes $21f_2$ and $21g_2$ in the supporting substrate 2.

As illustrated in FIG. 4B, an oxide film 18 is formed on the inner surface of the holes $21f_2$ and $21g_2$ by thermal oxidation to insulate the supporting substrate 2 from the built-in electrodes 10e to 10h. The oxide film 21 is patterned by using photolithography and etching technique to form a dry etching mask on the element substrate 1. At this point, the pattern formed on the element substrate 1 is so formed as to lie immediately above the pattern formed on the supporting substrate 2. Dry etching is performed with the oxide film 21 formed at the above process as a mask to form holes $21f_1$ and $21g_1$ in the element substrate 1. The holes $21f_1$ and $21g_1$ are smaller in diameter than the holes $21f_2$ and $21g_2$ and are formed with the same diameter as the bore diameter of the oxide film 18. The insulating layer 3 is removed by dry etching from the element-substrate side to form holes $21f_3$ and $21g_3$.

As illustrated in FIG. 4C, the holes $21f_1$, $21f_3$ and $21f_2$, and $21g_1$, $21g_3$ and $21g_2$ formed in the element substrate 1, the insulating layer and the supporting substrate 2 are filled with poly Si. The poly Si forms the built-in electrodes 10e and 10h that are caused to conduct with the element substrate 1 but insulated from the supporting substrate 2 because the oxide film 18 intervenes between the built-in electrodes 10e and 10h and the supporting substrate 2.

Such a production process produces the built-in electrodes 10e and 10h that are caused to conduct with the element substrate 1, but insulated from the supporting substrate 2 with the oxide film 18.

As described above, according to the present embodiment, the built-in electrodes 10a and 101 are formed in the through holes passing through the element substrate 1, the insulating layer 3 and the supporting substrate 2 to enable the through holes to be processed with a narrow pitch, allowing the physical sensor 50 to be miniaturized and increased in density. The portions where the glass cap 12 covers the area of the built-in electrodes 10a to 101 are anodically bonded to the element substrate 1, preventing the built-in electrodes from forming routes of gas or moisture between the outside and the hermetic seal portion 15 to ensure a long-term reliability.

Second to Fourth Embodiments

Figure 5:
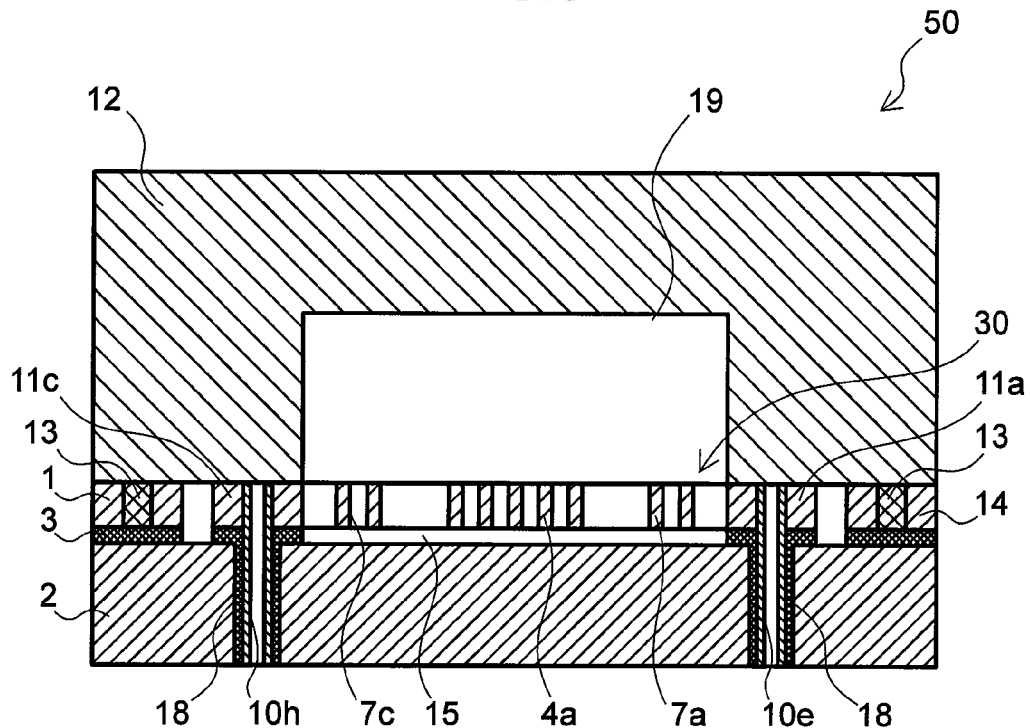
FIG. 5 is a cross section of a physical sensor of a second embodiment according to the present invention.
Figure 6:
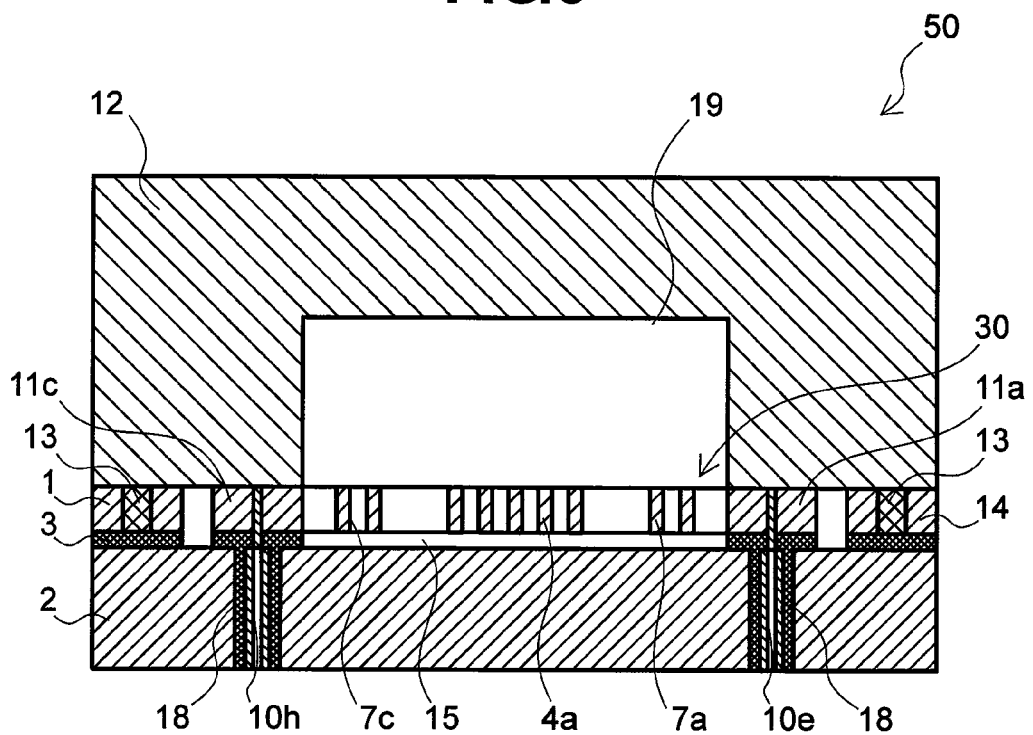
FIG. 6 is a cross section of a physical sensor of a third embodiment according to the present invention.
Figure 7:
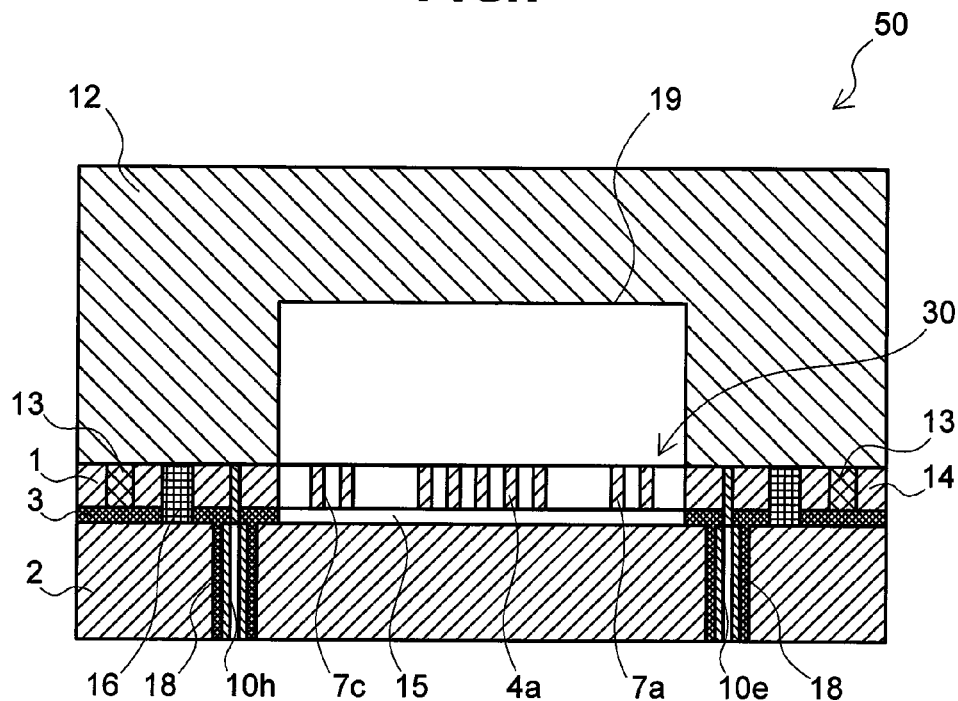
FIG. 7 is a cross section of a physical sensor of a fourth embodiment according to the present invention.

The second to the fourth Embodiment of the present invention are described below with reference to FIGS. 5 to 7. FIGS. 5 to 7 are cross sections of physical sensors of the second to the fourth embodiment according to the present invention. The second to the fourth Embodiment are different from the first embodiment in the following points. Other points are basically the same as in the first embodiment.

In the second embodiment, the built-in electrodes 10a to 101 are formed by thin film of electrically conductive metal or low-resistance poly Si on the inner surface of the through holes pasting through the element substrate 1, the insulating layer 3 and the supporting substrate 2, but the through holes are not fully filled with electrically conductive metal or low-resistance poly Si (out of the built-in electrodes 10a to 101, only two 10e and 10h are illustrated in FIG. 5). This significantly reduces time required for forming the built-in electrodes 10a to 101 to lower the cost. The glass cap 12 is anodically bonded to the element substrate 1 to cover the built-in electrodes 10a to 101 to prevent gas or moisture from flowing from the outside.

In the third embodiment, the hole for the built-in electrode is small on the side of the element substrate 1, but large at the place where the hole is formed in the supporting substrate 2. The built-in electrode 10 is formed of electrically conductive metal or low-resistance poly Si. The through holes of the element substrate 1 is filled with electrically conductive metal or low-resistance poly Si, however, the built-in electrode 10 is formed by thin film on the supporting substrate 2 and the through holes of the supporting substrate 2 is not filled with electrically conductive metal or low-resistance poly Si. This enables significantly reducing time required for forming the built-in electrodes 10a to 101 to resolve the inconvenience of gas flowing out through the interior space of the built-in electrodes 10a to 101 in the production process.

In the fourth embodiment, an insulator 16 is embedded inside the frame 14. This extends potential places as routes for gas or moisture to prevent gas or moisture from entering from the outside.

Fifth Embodiment

Figure 8:
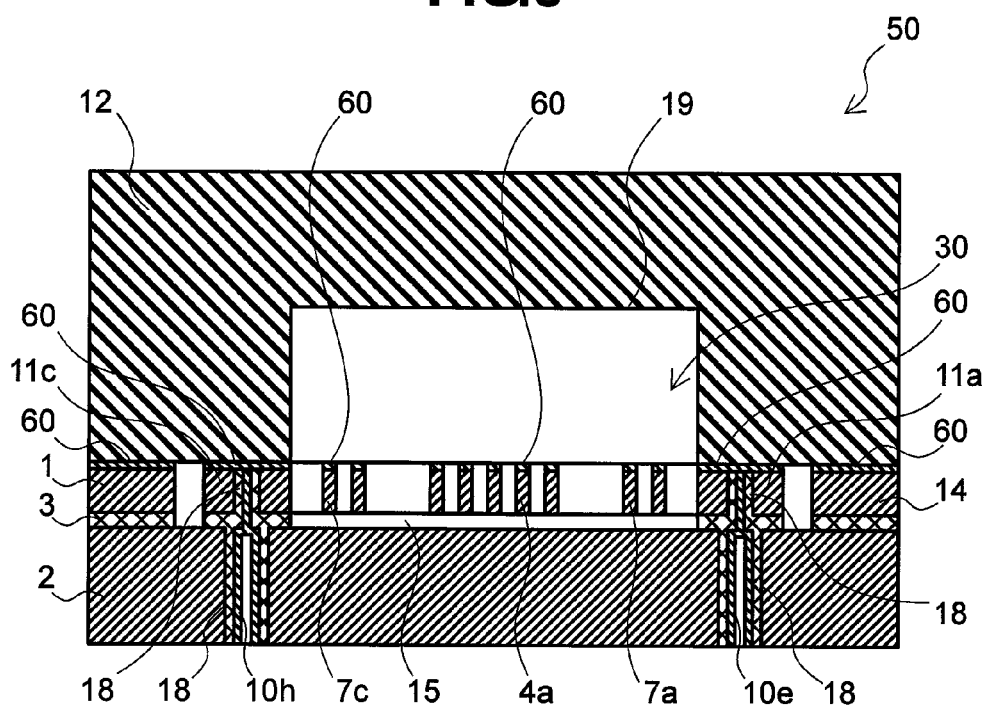
FIG. 8 is a cross section of a physical sensor of a fifth embodiment according to the present invention.

FIG. 8 illustrates the fifth embodiment. In the fifth embodiment, the insulating film 18 typified by a silicon thermal oxidation film is formed on the surface of the through holes passing through the element substrate 1. Specifically, this refers to the through holes provided on the fixed electrodes 11c and 11a. The through holes are filled with low-resistance poly Si or electrically conductive metal forming the built-in electrodes 10h and 10e. A low-resistance poly Si 60 for joint is formed on the surface of the element substrate 1. That is to say, as illustrated in FIG. 8, the low-resistance poly Si 60 for joint is formed also on the surfaces of the oscillatory body 4a, the movable electrodes 7a and 7c, the fixed electrodes 11a and 11c and the frame 14. The glass cap 12 is anodically bonded to the fixed electrodes 11a and 11c and the frame 14 through the low-resistance poly Si 60 for joint to seal the sensor element 30.

Since the low-resistance poly Si 60 for joint is formed on the fixed electrodes 11a and 11c, the fixed electrodes 11a and 11c are electrically connected to the built-in electrodes 10h and 10e even if the insulating film 18 is formed on the through holes of the fixed electrodes 11a and 11c. Accordingly, the built-in electrodes 10h and 10e can function as the built-in electrodes.

What is claimed is:
1. A physical sensor comprising:
a supporting substrate;

an element substrate that includes a sensor element and is joined to the supporting substrate through an insulating layer;
a glass cap that covers an area of the sensor element and is joined to the element substrate; and
a built-in electrode that is electrically connected to the sensor element; wherein,
the built-in electrode is formed in a through hole passing through the element substrate, the insulating layer and the supporting substrate;
a portion of the glass cap that covers the area of the built-in electrode is anodically bonded to the element substrate;
the element substrate includes a frame forming the periphery thereof and the sensor element formed inside the frame, and the sensor element is arranged in a hermetic seal portion surrounded by the frame, the insulating layer, the supporting substrate and the glass cap;
the element substrate including the frame and the sensor element is formed of silicon with a low resistance, an electrode portion of the sensor element is formed of an island-shaped electrode portion insulated with the insulating layer and the glass cap, and the built-in electrode is formed to electrically conduct in the through hole of the island-shaped electrode portion and formed through an insulating film in the through hole of the supporting substrate corresponding to the through hole of the island-shaped electrode portion; and
the through hole of the island-shaped electrode portion is smaller in diameter than the through hole of the supporting substrate corresponding to the through hole of the island-shaped electrode portion.

2. The physical sensor according to claim 1, wherein the built-in electrode includes a portion formed by filling in the through hole of the island-shaped electrode portion and a portion formed by a thin film on the inner surface of the through hole of the supporting substrate corresponding to the through hole of the island-shaped electrode portion.

3. The physical sensor according to claim 1, wherein the built-in electrode is formed by filling in both the through hole of the island-shaped portion electrode and the through hole of the supporting substrate corresponding to the through hole of the island-shaped electrode portion.

4. A physical sensor comprising:
a supporting substrate;
an element substrate that includes a sensor element and is joined to the supporting substrate through an insulating layer;
a glass cap that covers an area of the sensor element and is joined to the element substrate; and
a built-in electrode that is electrically connected to the sensor element; wherein,
the built-in electrode is formed in a through hole passing through the element substrate, the insulating layer and the supporting substrate;
a portion of the glass cap that covers the area of the built-in electrode is anodically bonded to the element substrate;
the element substrate includes a frame forming the periphery thereof and the sensor element formed inside the frame, and the sensor element is arranged in a hermetic seal portion surrounded by the frame the insulating layer, the supporting substrate and the glass cap;
the element substrate including the frame and the sensor element is formed of silicon with a low resistance, an electrode portion of the sensor element is formed of an island-shaped electrode portion insulated with the insulating layer and the glass cap, and the built-in electrode is formed to electrically conduct in the through hole of the island-shaped electrode portion and formed through an insulating film in the through hole of the supporting substrate corresponding to the through hole of the island-shaped electrode portion; and
the built-in electrode includes a portion formed by filling in the through hole of the island-shaped electrode portion and a portion formed by a thin film on the inner surface of the through hole of the supporting substrate corresponding to the through hole of the island-shaped electrode portion.

5. A physical sensor comprising:
a supporting substrate;
an element substrate that includes a sensor element and is joined to the supporting substrate through an insulating layer;
a glass cap that covers an area of the sensor element and is joined to the element substrate; and
a built-in electrode that is electrically connected to the sensor element; wherein,
the built-in electrode is formed in a through hole passing through the element substrate, the insulating layer and the supporting substrate, and
a portion of the glass cap that covers the area of the built-in electrode is anodically bonded to the element substrate;
the element substrate includes a frame forming the periphery thereof and the sensor element formed inside the frame, and the sensor element is arranged in a hermetic seal portion surrounded by the frame, the insulating layer, the supporting substrate and the glass cap;
the element substrate including the frame and the sensor element is formed of silicon with a low resistance, an electrode portion of the sensor element is formed of an island-shaped electrode portion insulated with the insulating layer and the glass cap, and the built-in electrode is formed to electrically conduct in the through hole of the island-shaped electrode portion and formed through an insulating film in the through hole of the supporting substrate corresponding to the through hole of the island-shaped electrode portion; and
the built-in electrode is formed by filling in both the through hole of the island-shaped portion electrode and the through hole of the supporting substrate corresponding to the through hole of the island-shaped electrode portion.

6. A method of producing a physical sensor including a supporting substrate, an element substrate that includes a sensor element and is joined to the supporting substrate through an insulating layer, a glass cap that covers an area of the sensor element and is joined to the element substrate, and a built-in electrode that is electrically connected to the sensor element, the method comprising the steps of:
producing an SOI substrate such that an insulating layer is sandwiched between a silicon supporting substrate and a silicon element substrate with the sensor element and joined thereto;
forming a through hole for forming the built-in electrode in the SOI substrate;
forming the built-in electrode so that the built-in electrode is passed through the through hole of the SOI substrate;
anodically bonding a portion of the glass cap that covers the area of the built-in electrode to the element substrate;
forming a hole with a large diameter in the supporting substrate from the side opposite to the element substrate of the SOI substrate;

forming a hole with a small diameter in the element substrate from the side opposite to the supporting substrate of the SOI substrate; and forming an insulating film on an inner surface of the hole with the large diameter.

7. A physical sensor comprising:

a supporting substrate;

an element substrate that includes a sensor element and is joined to the supporting substrate through an insulating layer;

a glass cap that covers an area of the sensor element and is joined to the element substrate; and a built-in electrode that is electrically connected to the sensor element; wherein, the built-in electrode is formed in a through hole passing through the element substrate, the insulating layer and the supporting substrate;

a portion of the glass cap that covers the area of the built-in electrode is anodically bonded to the element substrate; and an electrode portion of the sensor element is formed of an island-shaped electrode portion insulated with the insulating layer and the glass cap;

the built-in electrode is formed to electrically conduct through a poly Si film with a low resistance provided on a surface of the island-shaped electrode portion and formed through an insulating film inside the though hole of the island-shaped electrode portion and the though hole of the supporting substrate corresponding to the through hole of the island-shaped electrode portion; and the through hole of the island-shaped electrode portion Si is filled with the poly Si film with a low resistance.

* * * * *